United States Patent [19]
Blyth et al.

[11] Patent Number: 5,220,531
[45] Date of Patent: Jun. 15, 1993

[54] SOURCE FOLLOWER STORAGE CELL AND IMPROVED METHOD AND APPARATUS FOR ITERATIVE WRITE FOR INTEGRATED CIRCUIT ANALOG SIGNAL RECORDING AND PLAYBACK

[75] Inventors: Trevor Blyth, Milpitas; Richard T. Simko, Los Altos, both of Calif.

[73] Assignee: Information Storage Devices, Inc., San Jose, Calif.

[21] Appl. No.: 636,879

[22] Filed: Jan. 2, 1991

[51] Int. Cl.$^5$ .......................... G11C 7/00; G11C 11/40
[52] U.S. Cl. ..................... 365/189.07; 365/45; 365/168; 365/185
[58] Field of Search ............... 365/45, 163, 168, 185, 365/189.07; 437/172

[56] References Cited

U.S. PATENT DOCUMENTS

| | | | |
|---|---|---|---|
| 3,846,767 | 11/1974 | Cohen | 437/172 |
| 3,909,806 | 9/1975 | Uchida | 365/45 |
| 3,938,108 | 2/1976 | Salsbury et al. | 340/173 |
| 3,984,822 | 10/1976 | Simko et al. | 340/173 |
| 4,054,864 | 10/1977 | Audaire et al. | 340/173 |
| 4,099,196 | 7/1978 | Simko | 357/23 |
| 4,119,995 | 10/1978 | Simko | 357/23 |
| 4,181,980 | 1/1980 | McCoy | 365/45 |
| 4,225,946 | 9/1980 | Neale et al. | 365/163 |
| 4,228,524 | 10/1980 | Neale et al. | 365/163 |
| 4,279,024 | 7/1981 | Schrenk | 365/185 |
| 4,314,265 | 2/1982 | Simko | 357/23 |
| 4,318,188 | 3/1982 | Hoffmann | 365/45 |
| 4,357,685 | 11/1982 | Daniele et al. | 365/185 |
| 4,533,846 | 8/1985 | Simko | 307/550 |
| 4,627,027 | 12/1986 | Rai et al. | 365/45 |
| 4,701,776 | 10/1987 | Perlegos et al. | 357/23.5 |
| 4,890,259 | 12/1989 | Simko | 365/45 |
| 5,043,940 | 8/1991 | Harari | 365/185 |

OTHER PUBLICATIONS

Torelli et al., "An Improved Method for Programming a Word-Erasable EEPROM", Alta Frequenza, vol. 52, No. 5, Nov. 1983, pp. 487–494.
"Japanese Develop Non-Destructive Analog Semiconductor Memory", Electronics, Jul. 11, 1974, pp. 29–30.
Harold, "Production E.P.R.O.M. Loading", New Electronics, vol. 15, No. 3, Feb. 1982, pp. 47–50.
"A 1mV MOS Comparator" by Yen S. Yee, Lewis M. Terman, Lawrence G. Heller, IEEE Journal, Solid State Circuits, vol. SC-13, pp. 294–298, Jun. 1978.
1982 ISSCC Digest of Technical Papers re "A 16K E2PROM" by National Semiconductor Corp., p. 108.
"A 25ns 16K CMOS PROM Using a 4-Transistor Cell" (1985 ISSCC Digest of Technical Papers, pp. 162–163).
1989 ISSCC Digest of Technical Papers re "A 5V-Only 256k Bit CMOS Flash EEPROM" by Texas Instruments Inc.

Primary Examiner—Joseph L. Dixon
Assistant Examiner—Jack A. Lane
Attorney, Agent, or Firm—Blakely, Sokoloff, Taylor & Zafman

[57] ABSTRACT

Source follower storage cell and improved method and apparatus for iterative write for integrated circuit analog recording and playback which provides increased resolution in the stored signal and increased accuracy and stability of the storage and readout capabilities of the device. The storage cell is configured wherein the electrically alterable MOS storage device is connected in a source follower configuration, which provides a one to one relationship between the variation in the floating gate storage charge and the variation in the output voltage, and for high load resistance, relative insensitivity to load characteristics. The write process and circuitry provides a multi iterative programming technique wherein a series of coarse pulses program a cell to the approximate desired value, with a series of fine pulses referenced to the last coarse pulse being used for programming the respective cell in fine increments to a desired final programming level. Still finer levels of programming can be used.

16 Claims, 3 Drawing Sheets

SOURCE FOLLOWER STORAGE CELL AND IMPROVED METHOD AND APPARATUS FOR ITERATIVE WRITE FOR INTEGRATED CIRCUIT ANALOG SIGNAL RECORDING AND PLAYBACK

BACKGROUND OF THE INVENTION

1. Field of the Invention

The present relates to the field of non-volatile integrated circuit analog signal recording and playback wherein an analog signal is directly stored in and read out from a storage cell.

2. Prior Art

U.S. Pat. No. 4,890,259 discloses a high density integrated circuit analog signal recording and playback system wherein an analog input signal is sampled a plurality of times and then, as additional samples are being taken and temporarily held, a prior set of samples of the analog signal are parallel loaded into a plurality of storage sites or cells, each comprising nonvolatile floating gate memory cells, preferably EEPROM cells. In that system, writing of the groups of samples into the respective storage cells is done by repetitively providing a write pulse followed by a read operation for the respective cells to compare the information stored in each cell with the information held by the respective sample and hold circuit. During the successive write read operations, the write pulse is increased in amplitude, with the write pulse to any cell being stopped or decoupled from the cell when the information read from the cell in the last read operation equaled the value held in the respective sample and hold circuit. To provide time for the successive write read operations, a plurality of sample and hold circuits are provided so that an equal plurality of cells may be loaded or written to at one time. Still, because of practical limitations in the number of sample and hold circuits which may be provided and the limited length of time the integrated circuit sample and hold circuits will accurately hold the same values once taken, the length of time available for writing the sample signals to the storage cells in this parallel load fashion is limited. Thus, because each write read cycle takes a finite amount of time, the number of such cycles which may be completed before the same number of samples has again been taken and must similarly be loaded is limited. This in turn limits the resolution of the stored information which may be achieved by each write pulse while still allowing for properly storing samples which may be at either extreme of the storage range, particularly considering temperature variations, chip to chip processing variations and the like.

U.S. Pat. No. 4,627,027 discloses analog storage and reproducing apparatus utilizing nonvolatile memory elements. The apparatus disclosed therein utilizes a source follower type floating gate storage cell in a device which writes to each cell in a single write operation, as opposed to an iterative write process wherein successive write read operations provide and verify storage of the desired analog signal. In the implementation used in this patent the write circuits are completely separate from the read circuits so that during read, any variation in the characteristics of the load will produce a corresponding variation in the output. The constant current load, if ideal, would not create distortion but in reality any practical realization would create some disturbance. In addition, the different conditions between read the write significantly reduce reproduction quality.

BRIEF SUMMARY OF THE INVENTION

Source follower storage cell and improved method and apparatus for iterative write for integrated circuit analog recording and playback which provides increased resolution in the stored signal and increased accuracy and stability of the storage and readout capabilities of the device. The storage cell is configured wherein the electrically alterable MOS storage device is connected in a source follower configuration, which provides a one to one relationship between the variation in the floating gate storage charge and the variation in the output voltage, and for high load resistance, relative insensitivity to load characteristics. The write process and circuitry provides a multi iterative programming technique wherein a series of coarse pulses program a cell to the approximate desired value, with a series of fine pulses referenced to the last coarse pulse being used for programming the respective cell in fine increments to a desired final programming level. Still finer levels of programming can be used.

DETAILED DESCRIPTION OF THE INVENTION

Figure 1:
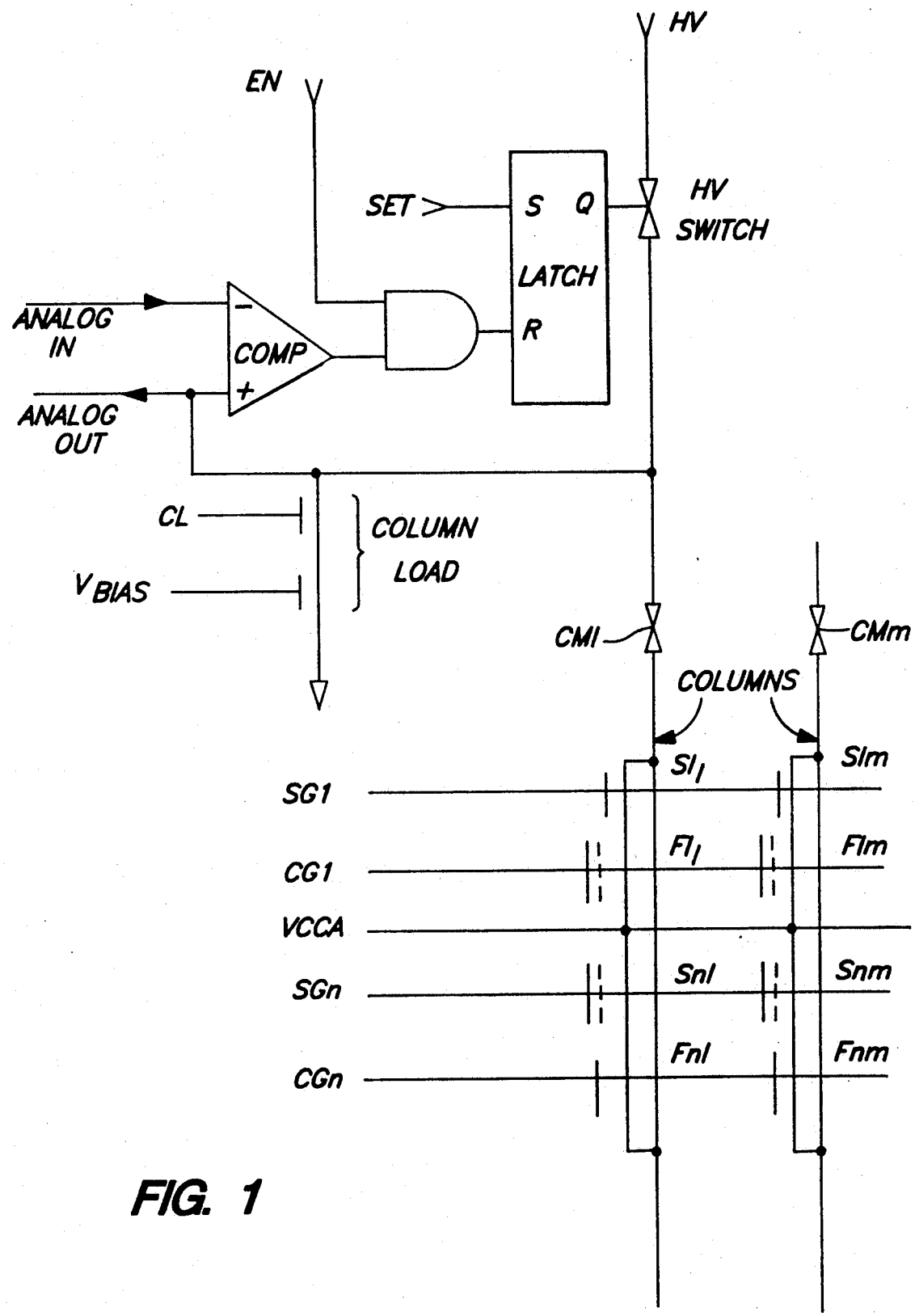
FIG. 1 is a schematic circuit diagram of a part of a memory array and associated circuitry of an analog storage device in accordance with the present invention.

First referring to FIG. 1, a basic implementation of the present invention may be seen. This figure represents a section of a typical memory array with one column driver consisting of comparator COMP, latch, high voltage (HV) switch and column load, column multiplexer comprising switches CM1 to CMm and a memory array consisting of n rows and m columns of transistor pairs Snm and Fnm. This figure of course is representative of one specific embodiment as, for example, there may be more than one column driver multiplexed (or not multiplexed) into the array, there may be more than one level of multiplexing of each column driver into the array, etc. Also the figure shows a single common node VCCA, but it may equally be separated into different nodes. For the purposes of the description of the first embodiment disclosed herein, the high voltage switch is shown as a simple switch, though in another embodiment disclosed herein the same consists of two switches, together with means to superimpose a fine adjustment voltage on a coarse voltage to more accurately program the storage cell within the typical available time for doing so.

A recording is made by the following sequence. The cells to be written (programmed) are first erased (cleared). This is done by applying a high voltage to a control gate, which is also referred to herein as the clear gate CGn while maintaining a low voltage on the drain of the cell. In the preferred embodiment circuits, each row has an independent connection in order to facilitate the clearing of each row independently without disturbing the analog samples recorded in other parts of the memory. The low drain voltage is achieved by applying a low voltage to VCCA. Since the high voltage on the clear gate causes the floating gate transistor to be in a conductive state, the low voltage is transposed to the drain. It would also be possible to apply the drain voltage through the column and select gate.

The voltage to be written is applied to ANALOG IN, a SET signal is applied to set the latch and turn on the HV switch, CL is taken low, all CG lines are taken low, and the desired column multiplex lines (CMm) and select gate lines (SGn) are taken high. Unselected columns and rows have their CM and SG lines low. The first high voltage pulse is then applied to HV and via the CMm and SGn transistors to the drain of the addressed cell. The level on CMm and SGn must be sufficient to pass the desired level onto the cell drain. In the preferred embodiment, CM and SG are at a higher voltage than HV so that HV, the regulated signal, is connected onto the drain without any loss of voltage. It would also be possible to regulate CM and/or SG in order to pass the desired level onto the drain. As HV is applied to the drain, VCCA is also brought positive. In the preferred embodiment the VCCA level, at this point in the procedure, is about 7 volts—this being higher than the maximum level to which the Fnm transistor would otherwise pull VCCA by follower action. (Note that although CGn is at VSS, the capacitive coupling onto the floating gate causes the transistor to conduct even though it may be fully discharged.) The purpose is to ensure that the column voltage does not become suppressed due to a current path to VCCA. Non-Suppression of VCCA could also be achieved by allowing VCCA to float, which may be satisfactory for VCCA nodes with small capacitance values and high voltage sources with low source impedance values. These values generally do not occur in practice. Now that the cell is in this writing condition, electron tunneling may occur from floating gate to drain, resulting in a net increase in the positive charge residing on the float gate. After a certain time period HV (and VCCA) is brought low—in the preferred embodiment and the discharge rate is controlled to avoid unnecessary perturbations onto other nodes.

The cell is now configured into the read mode. CL is taken high (connecting the current load onto the column), CMm and SGn remain high to keep the same cell addressed (although not necessarily at the same high voltages as before) and VCCA is taken to a positive voltage. Note that this is a source follower configuration and is a reversal from digital memories where the VCCA node would be grounded. The total resistance of the Snm transistor and the column multiplex transistor(s) should be small compared to the effective resistance of the load. The clear gate CGn voltage is taken to a fixed level which is chosen to optimize the voltage storage range—in the case of the preferred embodiment both VCCA and CGn are connected to 4 V. The voltage which is now output on the column is compared with ANALOG IN. EN is brought high and if ANALOG OUT is greater than ANALOG IN, the output of the comparator goes high and resets the latch. The HV switch is thus opened and the subsequent HV pulses are not connected to the cell. (Typically such high voltage pulses are of successively increasing amplitude.) If, however, ANALOG OUT is less than ANALOG IN, then the latch remains set and the next HV pulse is applied to the cell and the cells obtains another increment of tunnel current. The cell is alternatively configured in write mode and then read mode until a comparison is reached or a maximum number of cycles has been reached.

To play back the recording, the circuit is configured continuously into the read mode. The configuration and the cell operating conditions are exactly the same as during the write comparison and thus an accurate reproduction is achieved.

The resolution of analog recording is improved if the voltage increment on the EEPROM floating gate resulting from each high voltage iteration is as small as possible. In the case of commercially available speech recording devices, resolutions range from 6 bits to 16 bits of equivalent digital resolution. The recording method employed herein causes the voltage on the floating gate to be incremented during each high voltage pulse. The resolution achieved depends on the width of the high voltage write pulses and also on the amount of voltage increment between each successive pulse. Better resolution (i.e. smaller voltage increments) is achieved with narrow pulses and/or with smaller voltage increments of the high voltage pulse. However, this means that to cover the same range of floating gate voltages (i.e. the same dynamic range), there must be an increased number of applied high voltage pulses. In a given recording architecture there is a certain amount of time available to perform the writing of one row before beginning the write of the next row. This limits the number of pulses which can be applied and consequently limits the resolution which can be achieved. If the high voltage pulses increase linearly over the complete range, then each increment would give approximately equal increments to the floating gate. The first few pulses (which generally would follow an erase cycle) would probably cause a larger increment than subsequent pulses, but this is the major exception.

Figure 2:
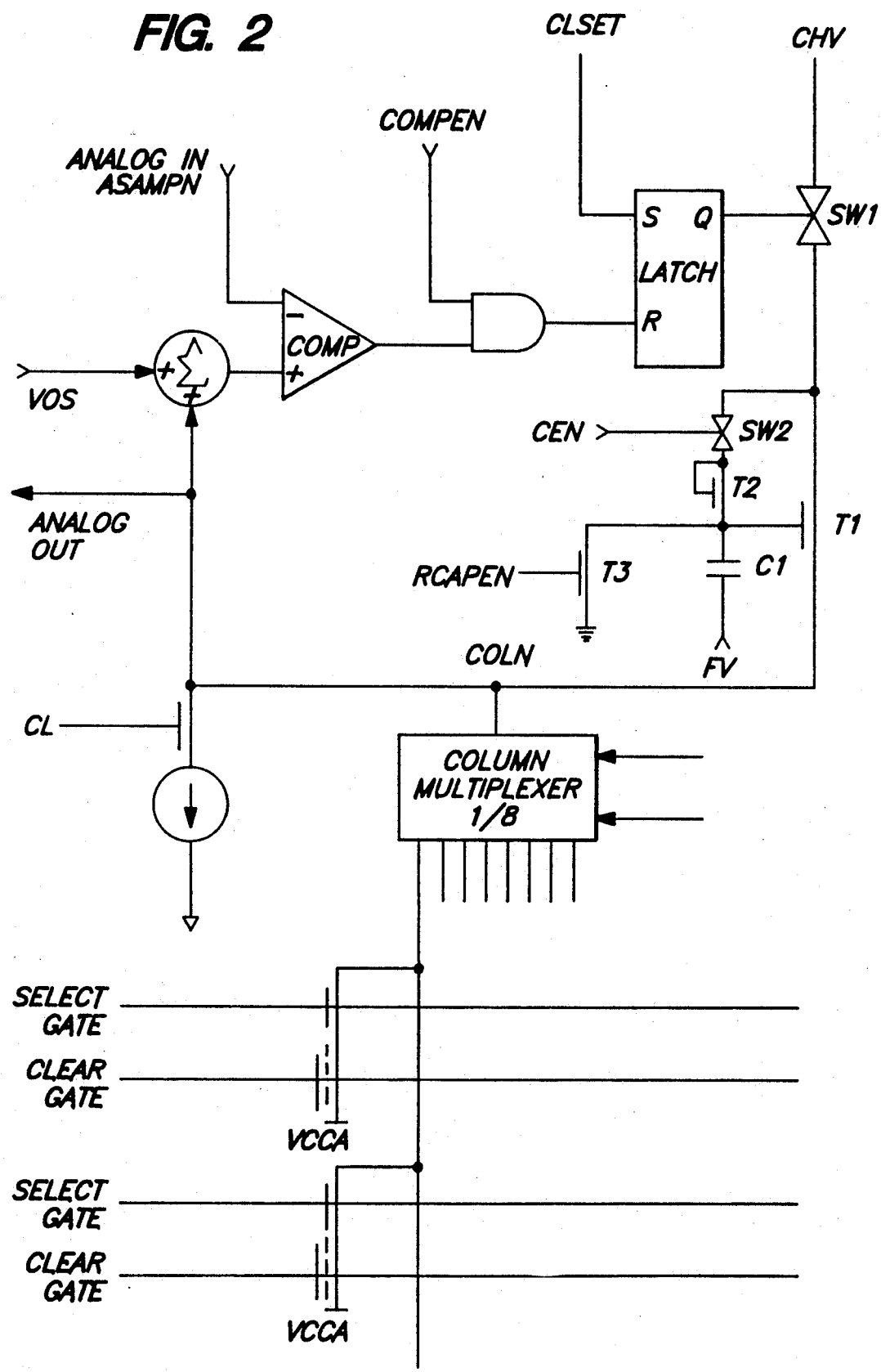
FIG. 2 is a schematic block diagram of a part of a memory array and associated circuitry of an analog storage device in accordance with an alternate and preferred embodiment of the present invention.

The technique used in the preferred circuit of FIG. 2 uses two bursts of voltage pulses (the method could be extended to more bursts). The first burst of pulses has monotonically increasing voltage levels (beginning with a level which produces a weakly programmed cell and ending with a level which produces a strongly programmed cell—i.e. from 8 volts to 18 volts). These will be called the coarse pulses. Coarse pulses are applied to the cell until the cell reaches a point where an additional pulse would program it to a level which is beyond the desired level. A second burst of pules is now applied which has a reduced voltage increment between adjacent pulses. These are termed the fine pulses. The voltage level of the first pulse in the fine burst is related to the level of the last coarse pulse applied to the cell. It can be the same level, slightly higher or slightly lower, but the important thing is that it is function of the last coarse pulse height. Fine pulses are applied to the cell until the cell is programmed to the desired level. The voltage level of the fine pulses may also have monotonically increasing values, but the voltage increment is much smaller than the increment during the coarse cycle. The fine pulses may also be of a narrower width than the coarse pulses.

In this scheme, the resolution of the floating gate voltage is determined by the voltage increment attained during the fine cycle. The voltage range, however, is determined by the coarse cycle.

Consider an ideal situation where:
Vr=Dynamic voltage range.

Vc = Floating gate voltage increment during coarse pulses
Vf = Floating gate voltage increment during fine pulses
Nc = Number of coarse pulses
Nf = Number of fine pulses
Then,
Nc = Vr/Vc
Nf = Vc/Vf
and
$N_{total}$ = Nc + Nf If the circuit did not use this dual (or multi) increment technique however, and the same resolution was required, then the total number of pulses required to cover the range would be:

$N_{total}$ = Vr/Vf = Vr/(Vc/Nf) = Nc*Nf

As an example, suppose we have a range of 1 V, a coarse increment of 0.1 V and a fine increment of 10 mV. Using the dual increment technique a total of 20 high voltages would be required versus 100 pulses with pulses of uniformly increasing magnitude.

In practice, the number of pulses required is greater than the ideal case because: 1) one must begin the coarse high voltage pulses at a lower level and continue past the ideal high level in order to account for manufacturing tolerances which change the relationship between the applied high voltage signals and the resulting voltages on the floating gate (e.g. variations in tunnel threshold). This is necessary when using either technique. 2) there must be a sufficient number of fine pulses to cover the complete voltage span of a single coarse step. At the upper end this is a similar problem to 1), but at the lower end it is due to practicalities in circuits which are used to implement the technique.

A block diagram of a circuit which utilizes a dual increment (coarse/fine) technique is shown in FIG. 2. In addition to the components of FIG. 1, there is an extra switch SW2, transistors T1, T2 and T3, capacitor C1 and a voltage summing junction. To initialize the circuit, a pulse is applied to CLSET to set the latch, CEN is set high to close SW2 and a pulse is applied to RCAPEN to discharge C1. The burst of course pulses is then applied to CHV and consequently is also applied to the cell provided that the latch remains set and SW1 is closed, as described previously. One important difference with this implementation compared to the basic circuit is that the connection of CHV to COLN is through the transistor T1. T1 requires a voltage on its gate which, in turn is provided by SW2 and T2. During the time that the cell voltage is read and compared with ANALOG IN, a voltage Vos is added to the voltage on COLN. The value of Vos is equal to or slightly greater than the floating gate voltage increment that results from a single coarse pulse. Adding Vos before the comparison is made with ANALOG IN ensures that the latch is reset one coarse pulse earlier than would otherwise occur. At this time, the latch is reset and the cell is thus programmed to a level which is no more than one coarse increment below the desired level. Also the gate voltage on T1 which corresponds to the last coarse pulse before comparison is stored on C1.

The latch is now set once more by applying a pulse to CLSET, CEN is taken low to open SW2 and the second burst of high voltage (fine) pulses are applied to CHV. These pulses are all of maximum amplitude, but the voltage which is transferred onto COLN through T1 depends on the stored level on C1 and the follower action of T1. The stored level on C1 is modulated by the signal FV, which in the preferred embodiment, is a ramp which begins at a low level (VSS) at the beginning of the fine cycle and rises to a higher level (2 V) at the end of the fine cycle. The magnitude of the high voltage pulses which are connected to the cell during the fine cycle is therefore dependent on the highest value reached during the coarse cycle and with increasing amplitudes as determined by FV. As with the coarse cycle, after each high voltage pulse the cell voltage is read and compared with ANALOG IN. During the fine cycle, however, Vos is held at VSS and the cell voltage is incremented in fine increments until a comparison is made.

Figure 3:
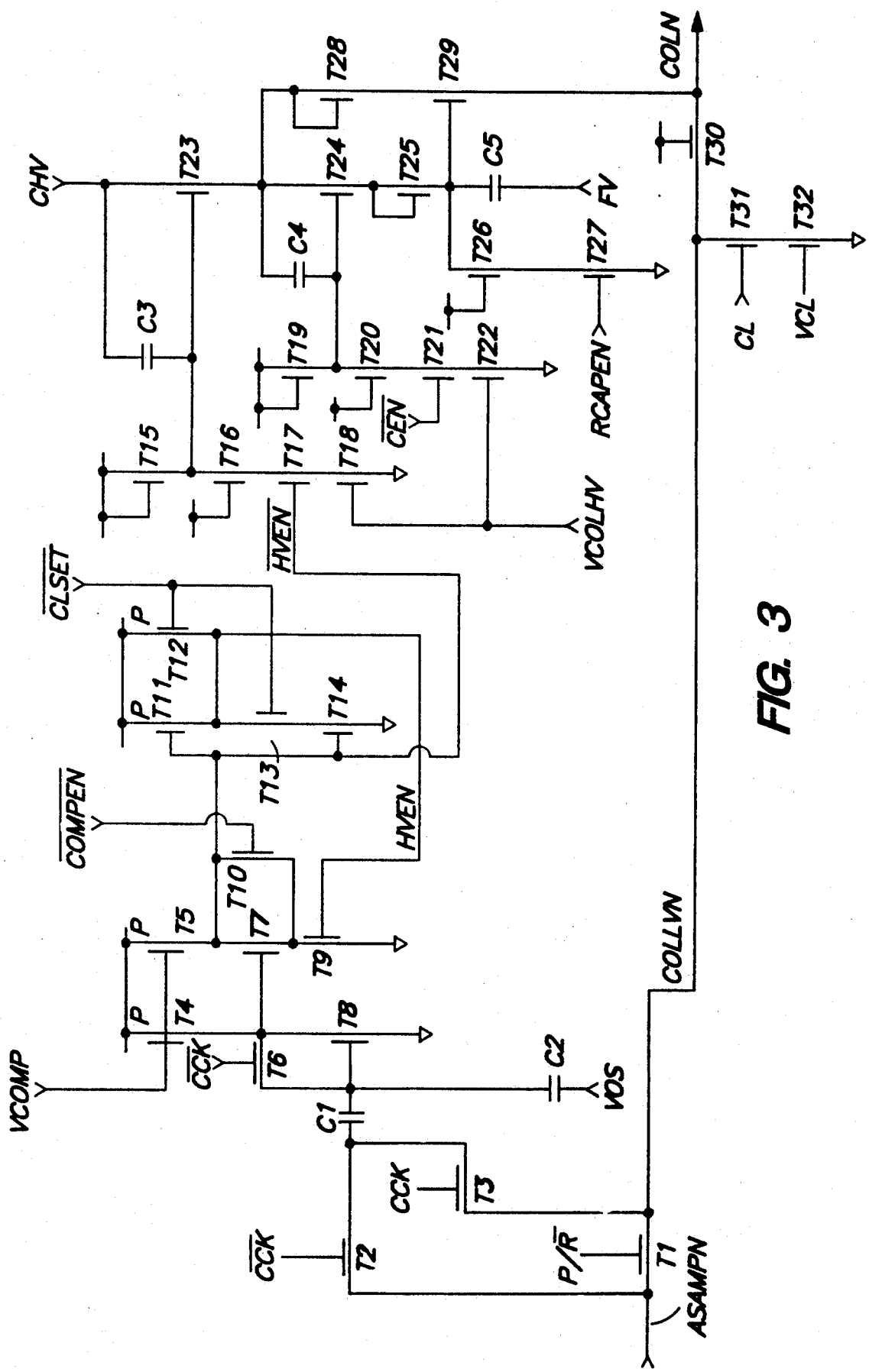
FIG. 3 is a detailed schematic diagram for the diagram of FIG. 2.

FIG. 3 shows a detailed schematic of the circuit. T2, T3, T4, T6, T8 together with C1 and C2 create an offset canceled comparator; T5, T7, T9, T10, T11, T12, T13 and T14 create an additional gain stage and latch; T15, T16, T17, T18, T23 and C3 create a high voltage switch; T19, T20, T21, T22, T24 and C4 create another high voltage switch; C5 is a holding capacitor and T29 acts as a source follower.

The write sequence begins with an erase cycle. In the following description it is assumed that the addressed cell has already been fully erased. When reading, the cell is configured in a source follower mode as previously described. The signal VCL applies a bias to T32 such that T30, T31, and T32 act as a load to VSS. (T30 is included to increase the voltage breakdown on the COLN node). This technique could also be utilized if the cell were configured in the arrangement which is more conventional to memory arrays, but an inversion would be necessary (for instance between the cell and COLN).

At the beginning of the write (programming) cycle, a negative pulse is applied to $\overline{CLSET}$ and a positive pulse is applied to RCAPEN. This sets the latch (HVEN goes high) and discharges C5 to 0V. VCOMP provides a bias such that T4 and T5 act as high impedance load devices. Likewise, VCOLHV cause T18 and T22 to behave as load devices, in this case to VSS. P/R is held low and is only allowed to go high during playback. $\overline{CEN}$ is initially held low. CL is low during write and high during read. The voltage which is desired to be written into the EEPROM cell is applied to ASAMPN. The first high voltage pulse of the coarse cycle is applied to CHV. It could typically be about 10 V amplitude with a finite rise time and pulse duration. Since $\overline{HVEN}$ is low, T17 is off and the voltage on the gate of T23 rises as a result of the CHV ramp on C3. Other capacitances on the gate of T23 are small relative to C3 and consequently there is very little capacitive or voltage division. There is also the self bootstrap effect of T23 itself and so the gate of T23 increases in voltage by an amount almost equal to CHV. The starting voltage on T23 gate was (VCC−Vt) or about 4 V, so with Vt typically about 1 V, the transistor T23 is turned fully on and CHV is conducted onto C4. The components T15, T16, T17, and T18, T23 and C3 operate like a high voltage switch enabled by $\overline{HVEN}$ (other implementations of the switch are possible). In a similar fashion, the other switch using T24 also conducts and C5 is charged to (CHV−Vt)—the Vt drop is due to T25. T29 now conducts and allows COLN to rise to (CHV−Vt−Vtn). It is the enhancement threshold (of T25), and Vtn is the threshold of native transistor T29. It is assumed that the Vt of T28 is less than or equal to T25. Hence the CHV pulse is applied to COLN and subsequently to the cell with a small amount of voltage drop due to thresholds. After CHV is returned to its low level, the voltage read from the cell is compared with ASAMPN. $\overline{CCK}$ and CCK are inverse signals; $\overline{CCK}$ is initially high and gates ASAMPN on to C1 via T2. T6 is also driven by $\overline{CCK}$ and biases the invertor T8/T4 in its linear region and cancels the offset. T7 gate has the same voltage as (matched) T8 and its source is at VSS, so the invertor T5, T7, T9 is also in the linear region. $\overline{CCK}$ then goes low and CCK goes high. The cell has since been configured in its read mode and thus the cell voltage is coupled onto C1. The change in voltage on the LHS of C1 is coupled onto the gate of T8. (It is important that $\overline{CCK}$ goes low before CCK goes high in order to ensure that there is no charge loss through T6). Simultaneously, a positive going signal is applied to Vos (in the preferred embodiment it is 1.5 V, derived from analog signal ground) and couples additional charge onto T8. The value of capacitor C2 is chosen so as to couple charge that is equivalent to a voltage slightly greater than the voltage increment that results on the floating gate during each coarse pulse. Since the invertor is in its linear region, the change at the gate of T8 causes a corresponding change in the drain of T8, multiplied by the gain of the invertor. The size of T6 is kept small so as to minimize the capacitive coupling from $\overline{CCK}$ to the input of the invertor. The coupling can be reduced further by connecting an equal capacitor to the gate of T8 but within equal and opposite phase of signal. This can be a "dummy" transistor similar to T6, or, as is often done, it can be a P-channel transistor in parallel with T6 and driven by an opposite signal. these steps were not taken, however, because the offset introduced here is a systematic offset which is equal in all similar circuits, including the reference circuit and is therefore canceled out. If the comparator were realized by some of the other techniques, such as those with differential input pairs of transistors, the random offset is ultimately superimposed on the recorded cell voltage. The comparator circuit is thus realized with a small number of components. The gain of the invertor (and the subsequent stage T7), can be increased by using a high impedance load device. In the case of this implementation the high impedance is achieved by using current mirror devices T4 and T5 in their saturated regions.

With the change is state of $\overline{CCK}$ and CCK, an amplified difference level exists on the gate of T7. After a short settling time, $\overline{COMPEN}$ is brought low. The drain of T7 was previously held low by T10, but it now is allowed to function as an additional gain stage, providing an amplified, noninverted difference level at this point. The transistors T11 through T14 form a CMOS nand gate which is connect ed in a cross-coupled latch arrangement with the last gain stage. Transistors T5, T7, T9 and T10 serve a dual function—a gain stage and a latch. If the cell voltage plus the 0.2 V offset caused by Vos is less than ASAMPN the latch remains set (HVEN is high); if the cell voltage plus 0.2 V is greater than ASAMP the latch becomes reset when enabled by $\overline{COMPEN}$. The comparator is sensitive to input differences in the order of 1 mV. The systematic offset due to T6 coupling is about 17 mV, which is expected to be consistent to within 2 mV across chip. With 3 mV of overdrive the latch settles to the final logic state in 1 microsecond.

The signal $\overline{HVEN}$ is used to enable the first switch on the high voltage path. As long as the latch remains set, the switch is enabled and CHV pulses of continually increasing magnitude are applied to the cell. After the latch has been reset, the switch is disabled. CHv pulses may continue to be supplied, but they do not pass through the switch transistor T23 and no further coarse pulses are applied to COLN (the cell). The voltage on C4 has been increasing during each CHV pulse that $\overline{HVEN}$ was low. After $\overline{HVEN}$ goes high and the switch T23 stays open, the highest value reached is retained due to the diode action of T25 (RCAPEN is held low).

CHV pulses continue until their voltage level (and the number of pulses) has been sufficient to strongly program a cell. In this preferred design and process, the maximum CHV level is 21 V. After the last coarse CHV pulse, all latches in the column driver circuits should have been set (provided that all the ASAMPN voltage levels are in the dynamic signal range).

The fine cycle now begins. $\overline{CEN}$ is taken high, thus disabling the second switch; $\overline{CLSET}$ is pulsed low and then high again, resetting the latch and enabling the first switch. Another burst of CHv pulses is supplied, this time of equal magnitude (21 V) but with half the repetition period of the coarse pulses. The shorter pulses allow a smaller amount of charge to be tunneled onto the floating gate during each high voltage pulse, as well as allowing more pulses of smaller voltage increments. The CHV pulses which are input to the circuit are of maximum amplitude, but the voltage which is applied to COLN depends on the stored voltage on the gate of T29 and the high voltage storage capacitor. As COLN rises with CHV, the coupling action onto the gate returns the gate voltage to precisely the same level that existed during the last coarse pulse and consequently the level applied to COLN is the same level as that which was applied during the last coarse pulse. There is provision in the circuit for applying adjustments to the COLN voltage, however. The bottom plate of C5 is driven by another external signal FV. The circuit would function if FV remained at a fixed voltage throughout the complete write operation, but enhanced performance is attained by manipulating FV. The preferred implementation of the circuit and its support circuits applies a ramp to FV. During the coarse cycle, FV is held at a fixed level of about 2 V and is brought to 0V at the beginning of the fine cycle. FV ramps up linearly from 0V at the beginning of the fine cycle to 2 V at the end of the fine cycle. This ramp is superimposed on the stored on C5 and consequently on the voltage amplitude of the high voltage pulses applied to COLN.

During the fine cycle, Vos is held at a fixed voltage and not pulsed, as was the case during the coarse cycle. Thus the cell floating gate continues to increment in fine voltage steps until the read voltage is greater than ASAMPN, at which time the latch is set, switch T23 remains open and the cell does not receive any further pulses.

In the preferred embodiment, the coarse and fine programming characteristics are as follows:

| | |
|---|---|
| Number of coarse pulses | 45 |
| Number of fine pulses | 90 |
| Minimum coarse CHV voltage | 11 V |
| Maximum coarse CHV voltage | 21 V |
| Minimum coarse COLN voltage | 9 V |
| Maximum coarse COLN voltage | 18 V |

-continued

| | |
|---|---|
| Coarse CHV rise time | 420 mv/μsec |
| Fine CHV rise time | 840 mv/μsec |
| Coarse CHV pulse width (@ 1 v) | 100 μsec |
| Fine CHV pulse width (@ 1 V) | 50 μsec |
| FV ramp | 0-2 V |
| Vos pulse height | 1.5 V |

In the embodiment of the invention just described and for both series of programming pulses, once the read and compare operations find that the desired programming level for that series of pulses has been reached, a latch blocks further programming pulses of that series from passing to the cell, even though the read and compare operations are in fact continued until the end of the respective series of programming pulses. The continuance of the read and compare operations is an arbitrary design choice, but the blocking of further programming pulses of that series from passing to the cell once the desired compare is obtained is important, as otherwise subsequent noise might disturb a subsequent compare operation, allowing a much higher pulse of that series to pass to the cell, resulting in a single but large programming increment above the programming level desired.

While the preferred embodiment of the present invention has been disclosed and described herein, it will be obvious to those skilled in the art that various changes in form and detail may be made therein without departing from the spirit and scope thereof.

We claim:

1. A method of iterative writing a signal sample to a non-volatile floating gate type integrated circuit storage cell for integrated circuit analog recording and subsequent playback comprising the steps of:
   (a) providing a first series of programming voltage pulses of increasing amplitude to the storage cell;
   (b) after each programming voltage pulse of step (a), reading the storage cell and comparing the signal read therefrom with the signal sample desired to be written thereto;
   (c) terminating the application of the first series of programming voltage pulses to the storage cell when the signal read from the storage cell in step (b) reaches a first predetermined relationship to the signal sample to be recorded;
   (d) providing a second series of programming voltage pulses of increasing amplitude to the storage cell, the second series of programming voltage pulses increasing in amplitude in smaller increments than the first series of programming voltage pulses;
   (e) after each programming voltage pulse of step (d), reading the storage cell and comparing the signal read therefrom with the signal sample desired to be written thereto; and
   (f) terminating the application of the second series of programming voltage pulses to the storage cell when the signal read from the storage cell in step (e) reaches a second predetermined relationship to the signal sample to be recorded.

2. The method of claim 1 wherein the second series of programming pulses as applied to the storage cell is referenced to the magnitude of the first series of programming pulses when the application of the first series of programming pulses to the storage cell was terminated in step (c).

3. The method of claim 2 wherein each pulse in the second series of pulses are of shorter duration than the pulses in the first series of pulses.

4. The method of claim 3 wherein the maximum time allotted for the application of the second series of pulses is substantially equal to the maximum time allotted for the application of the first series of pulses.

5. The method of claim 1, 2, 3 or 4 wherein the storage cell comprises a floating gate MOS storage device connectable in a source follower read configuration, and wherein the MOS storage device is configured in the source follower configuration in steps (b) and (e), whereby there is a substantially one to one relationship between the voltage on the floating gate MOS storage device of a cell and the respective signal read therefrom.

6. The method of claim 5 wherein the reading of the MOS storage cell of steps (b) and (e) is carried out in the same configuration as subsequent playback of the signal sample written to the MOS storage cell.

7. A method of storing signal samples for integrated circuit analog recording and subsequent playback comprising the steps of:
   (a) providing a plurality of storage cells, each having a floating gate MOS storage device with a source, a drain and a control gate and connectable in a source follower read configuration;
   (b) taking a plurality of samples of an analog signal and temporarily holding the same in an equal plurality of sample and hold circuits;
   (c) providing a first series of programming voltage pulses of increasing amplitude to the drain of each of the MOS storage cells;
   (d) after each programming voltage pulse of step (c), reading the MOS storage cells in the source follower read configuration and comparing each signal read therefrom with the signal temporarily held in the respective sample and hold circuit;
   (e) for each respective MOS storage cell, terminating the application of the first series of programming voltage pulses of step (c) to the respective MOS storage cell when the signal read from the respective storage cell in step (d) reaches a first predetermined relationship to the signal held in the respective sample and hold circuit;
   (f) providing a second series of programming voltage pulses of increasing amplitude to the drain of each of the MOS storage cells;
   (g) after each programming voltage pulse of step (f), reading the MOS storage cells in the source follower read configuration and comparing each signal read therefrom with the signal temporarily held in the respective sample and hold circuit; and,
   (h) for each respective MOS storage cell, terminating the application of the second series of programming voltage pulses of step (f) to the respective MOS storage cell when the signal read from the respective storage cell in step (g) reaches a second predetermined relationship to the signal held in the respective sample and hold circuit.

8. The method of claim 7 wherein the reading of the MOS storage cell of step (d) is carried out in the same way as subsequent playback of the signal sample written to the MOS storage cell.

9. Apparatus for writing a signal sample to a non-volatile floating gate type integrated circuit storage cell in an integrated circuit analog recording and playback system comprising:

first means for providing a first series of programming voltage pulses of increasing amplitude to the storage cell;

second means for reading the storage cell after each programming voltage pulse and comparing the signal read therefrom with the signal sample desired to be written thereto;

third means for terminating the application of the first series of programming voltage pulses to the storage cell by the first means when the signal read from the storage cell by the second means reaches a first predetermined relationship to the signal sample to be recorded;

fourth means for providing a second series of programming voltage pulses of increasing amplitude to the storage cell, the second series of programming voltage pulses increasing in smaller increments than the first series of programming voltage pulses of the first means;

the second means also being a means for reading the storage cell and comparing the signal read therefrom with the signal sample desired to be written thereto after each programming voltage pulse of the second series; and fifth means for terminating the application of the second series of programming voltage pulses to the storage cell when the signal read from the storage cell reaches a second predetermined relationship to the signal sample to be recorded.

10. The apparatus of claim 9 wherein the fourth means for providing the second series of programming pulses is a means referenced to the magnitude of the first series of programming pulses when the application of the first series of programming pulses to the storage cell was terminated.

11. The apparatus of claim 10 wherein each pulse in the second series of pulses are of shorter duration than the pulses in the first series of pulses.

12. The apparatus of claim 11 wherein the maximum time of the second series of pulses is substantially equal to the maximum time of the first series of pulses.

13. The apparatus of claim 9, 10, 11 or 12 wherein the MOS storage cell comprises a floating gate storage device connectable in a source follower read configuration, whereby there is a substantially one to one relationship between the voltage on the floating gate MOS storage device of a cell and the respective signal read therefrom.

14. The apparatus of claim 13 wherein said second means is also a means for subsequently reading the MOS storage cell for playback, whereby the read operations when writing a signal sample to the MOS storage cell are the same as the read operations for playback.

15. Apparatus for storing signal samples for integrated circuit analog recording and subsequent playback comprising:

a plurality of storage cells, each having a floating gate MOS storage device having a source, a drain and a control gate and connectable in a source follower read configuration;

a plurality of sample and hold circuits for taking an equal plurality of samples of an analog signal and temporarily holding the same;

first means for providing a first series of programming voltage pulses of increasing amplitude to the drain of each of the MOS storage cells;

second means for reading the MOS storage cells in the source follower configuration after each programming voltage pulse and comparing each signal read therefrom with the signal temporarily held in the respective sample and hold circuit;

third means for terminating the application of the first series of programming voltage pulses to the respective MOS storage cell for each respective MOS storage cell when the signal read from the respective storage cell by the second means reaches a first predetermined relationship to the signal held in the respective sample and hold circuit;

fourth means for providing a second series of programming voltage pulses of increasing amplitude to the drain of each of the MOS storage cells;

the second means also being a means for reading the MOS storage cells after each programming voltage pulse of the second series and comparing each signal read therefrom with the signal temporarily held in the respective sample and hold circuit; and, fifth means for terminating the application of the second series of programming voltage pulses to the respective MOS storage cell when the signal read from the respective storage cell by the second means reaches a second predetermined relationship to the signal held in the respective sample and hold circuit.

16. The apparatus of claim 15 wherein the plurality of MOS storage cells comprise a two dimensional array of MOS storage cells.

* * * * *